United States Patent
Giebeler et al.

(10) Patent No.: US 6,876,574 B2
(45) Date of Patent: Apr. 5, 2005

(54) MAGNETORESISTIVE DEVICE AND ELECTRONIC DEVICE

(75) Inventors: Carsten Giebeler, Edinburgh (GB); Kars-Michiel Hubert Lenssen, Eindhoven (NL); Stephan Johann Zilker, Eindhoven (NL); Reinder Coehoorn, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/228,602

(22) Filed: Aug. 27, 2002

(65) Prior Publication Data

US 2003/0042562 A1 Mar. 6, 2003

(30) Foreign Application Priority Data

Aug. 30, 2001  (EP) ............................................ 01203265

(51) Int. Cl.⁷ ........................ G11C 11/02; H01L 31/119
(52) U.S. Cl. .......................... 365/158; 365/173; 257/40; 257/295
(58) Field of Search ............................. 438/962; 257/35, 257/40, 295, 421, E51.028, E51.027, E29.245, E21.404, E51.04, E43.001, 425, 31; 365/158, 173, 175

(56) References Cited

U.S. PATENT DOCUMENTS 5,612,255 A * 3/1997 Chapple-Sokol et al. ... 438/197
6,297,987 B1 * 10/2001 Johnson et al. ............. 365/158
6,621,100 B2 * 9/2003 Epstein et al. ............... 257/40

FOREIGN PATENT DOCUMENTS

WO  WO 9825263  11/1997 ........... G11B/5/127
WO  WO 0010024  2/2000 ........... G01R/33/09
WO  WO 0235715  10/2001

OTHER PUBLICATIONS

Patent Abstracts of Japan, vol. 2000, No. 16, May 8, 2001, JP2001006930.

Letters to Nature, Flederling, et al., "Injection and detection of a spin–polarized current in a light–emitting diode," Dec. 16, 1999, vol. 402, pp. 787–789.

Letters to Nature, Kikkawa et al., "Lateral drag of spin coherence in gallium arsenide," Jan. 14, 1999, vol. 307, pp. 139–141.

Datta et al., "Electronic analog of the electro–optic modulator," Feb. 12, 1990, vol. 56, No. 7, pp. 665–667.

Rashba, "Theory of electrical spin injection: Tunnel contacts as a solution of the conductivity mismatch problem," Physical Review B, vol. 62, No. 24, Dec. 15, 2000–II, pp. 267–270.

Naji et al., "7.6 A 256kb 3.0V 1T11MTJ Nonvolatile Magnetoresistive," IEEE International Solid–State Circuits conference, 2001, pp. 122–123, 438.

* cited by examiner

Primary Examiner—Tom Thomas
Assistant Examiner—Matthew C Landau
(74) Attorney, Agent, or Firm—Aaron Waxler

(57) ABSTRACT

A magnetoresistive device (11) having a lateral structure and provided with a non-magnetic spacer layer (3) of organic semiconductor material allows the presence of an additional electrode (19). With this electrode (19), a switch-function is integrated into the device (11). Preferably, electrically conductive layers (13,23) are present for the protection of the ferromagnetic layers (1,2). The magnetoresistive device (11) is suitable for integration into an array so as to act as an MRAM device.

6 Claims, 2 Drawing Sheets

MAGNETORESISTIVE DEVICE AND ELECTRONIC DEVICE

Figure 1:
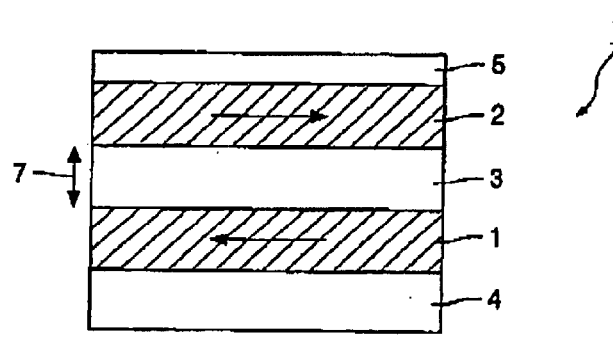

The invention relates to a magnetoresistive device comprising a substrate which carries a first and a second magnetic layer for providing a magnetoresistive effect, said first and said second layers being separated by a non-magnetic spacer layer.

The invention also relates to an electronic device provided with a magnetic memory including an array of magnetoresistive devices.

Such a magnetoresistive device is known from WO-A-00/10024. The first magnetic layer in said device is preferably a so-called free layer, the second magnetic layer is a so-called pinned layer, i.e. a layer with a large uniaxial anisotropy due to the magnetic exchange interaction with an antiferromagnetic layer. Both the first and the second magnetic layers are ferromagnetic. The free layer is a layer whose magnetization direction can be changed by applying magnetic fields with a strength lower, preferably substantially lower, than the strength of the field required for changing the magnetization direction of the pinned layer. The pinned layer thus has a preferred, substantially fixed magnetization direction, whereas the magnetization direction of the free layer can be changed quite easily under an externally applied field. A change in the magnetization direction of the free layer changes the resistance of the magnetoresistive device. The effect produced in the device is either the Giant Magneto-Resistance (GMR) effect or the Spin-Tunnel Magneto-Resistance (TMR) effect. In a device utilizing the GMR-effect, the non-magnetic spacer layer is metallic. In a device utilizing the TMR-effect, the non-magnetic spacer layer is insulating, for example $Al_2O_3$. This spacer layer allows for a significant probability for quantum-mechanical tunneling of electrons between the first and second ferromagnetic layers.

The characteristics of these magnetoresistive devices may be exploited in different ways. They can be used for advanced hard disk thin film heads. Magnetic memory devices such as non-volatile stand-alone or embedded memory devices may also be made, based on the GMR and the TMR effect. An example of such a memory device is a Magnetic Random Access Memory (MRAM) device. A further application is a sensor device. Such sensors are used, for example, in anti-lock braking (ABS) systems.

It is a disadvantage of the known magnetoresistive device that its manufacture is complicated. The device may either be present as a stack of layers, or as a lateral structure. The stack of layers has the disadvantage that the spacer layer has to be very thin, some nanometers only. The lateral structure has the disadvantage that the distance between the first and second magnetic layer must be very short, e.g. about 10 nanometers only. If the thickness of the spacer layer were larger, or if the mutual distance were larger, then no measurable magnetoresistive effect would be obtained.

It is therefore a first object of the invention to provide a magnetoresistive device of the kind mentioned in the opening paragraph of which the spacer layer has less critical dimensions.

The first object of the invention is achieved in that:
the first and second layer are patterned and laterally spaced apart on the substrate, and the spacer layer comprises a semiconductor material with a chain-like molecular structure.

A first characteristic of the magnetoresistive device of the invention is its lateral structure. It is an advantage thereof that the thickness of the spacer layer is not critically relevant for the operation of the device; instead, the magnetoresistive effect is strongly dependent on the distance between the first and the second magnetic layer. Photolithography or other lithographic techniques, such as soft lithography, may be used for obtaining a desired distance.

A second characteristic of the magnetoresistive device of the invention is that its spacer layer comprises a semiconductor material with a chain-like molecular structure. In such a chain-like, primarily one dimensional molecular structure, the charge transport is less hindered by interaction with neighbouring atoms. It is believed to happen primarily via the delocalized electronic structure and less via vacancies in the lattice. As a consequence, the spin diffusion length is longer. This means that the spins of the electrons which are responsible for the magnetoresistive effect, are maintained in their original direction much longer than in conventional inorganic materials.

This has the advantageous effect that the distance between the first and the second magnetic layer can be larger than some nanometers. It is preferably in the range of 50 to 500 nanometers, especially approximately 100 nanometers. Such a distance may be obtained, for example, with e-beam lithography. Furthermore, the electrical resistance of a region of the spacer layer located between the two magnetic layers is small enough for obtaining a measurable magnetoresistive effect at room temperature. The upper limit is dependent on the spin diffusion length of the material used with chain-like molecular structure, but the shorter the distance, the larger the magnetoresistive effect. For reasons of clarity, said distance is defined as the shortest distance between the mutually opposed side faces of the first and the second magnetic layers.

A report on the transport of electronic spins in a GaAs substrate has been published by J. M. Kikkawa and D. D. Awschalom, Nature 397, 139 (1999). Although this report discusses this transport in connection with giant-magnetoresistive systems and spin-valve transistors, it does not present any magnetoresistive device. Besides, the transport is studied at a temperature of 1.6 K, which is not a temperature useful in any integrated circuit. Furthermore, the presence of the spacer layer as a substrate hinders integration with other elements. In the magnetoresistive device of the invention, the semiconductor is applied as a separate layer, preferably at the end of the manufacturing process. Thus standard Si technology is available for manufacturing structures.

It is an advantage of the device of the invention that the semiconductor material can be deposited by alternative methods which are easy and relatively inexpensive. Whereas expensive processes such as MBE deposition in ultrahigh vacuum or chemical vapor deposition (CVD) must be used for the II-VI and III-V type semiconductors, spin-coating, dip-coating or vapour deposition may be used under standard conditions for the deposition of any semiconductor material of the invention. Furthermore, the semiconductor material can be applied as the last functional layer, after the deposition of the electrically conducting and magnetic layers.

It is another advantage of the device of the invention that it can be made flexible. Being a layer that is processable in solution, the semiconductor is flexible and can be deposited on a flexible substrate. The magnetic layers in the device are thin enough, so that they are no obstacle to the flexibility of the device. Other layers present may be chosen so as to be flexible magnetic layers.

In a first embodiment, the material of the spacer layer is an organic semiconductor material. The material is semiconducting or electrically conducting. The material is organic, as organic materials have a more favorable structure and composition for spin-polarized transport than commonly used inorganic ones. In a π-conjugated organic system, only p-levels are delocalized and are consequently mainly responsible for charge transport. Their wave functions are zero at the site of the nucleus, leading to a minimal hyperfine interaction. The latter is one of the two main processes leading to spin-flips. The second one is spin-orbit coupling which increases with the mass of the involved nuclei. The latter are comparatively small in organic systems, in particular in systems in which the heaviest atoms are C or N. Thus charge carriers in organic materials have a long spin diffusion length, however, this may vary substantially among different materials.

Organic semiconductor materials are known per se, and can be applied by vapour deposition and by spincoating, printing, and other solution processing techniques. For the solution processing the organic semiconductor material may be applied as a processor material or as a blend or contain processing-enhancing side chains.

In a second embodiment, the semiconductor material of the spacer layer is a nanowire. Nanowires, of, for instance, silicon, carbon, InP, GaAS, are ultrathin, wires of a semiconductor material, that can be doped, and which exhibit extremely advantageous semiconductor properties, as is per se known from Gudliksen et.at, Nature 415(2002), 617–620. They can be made separately, for instance, by growing in a CVD reactor or by etching a semiconductor substrate of a desired material.

A preferred example of a nanowire is a carbon nanotube, which has a low spin-orbit coupling.

Nanowires can be provided in a solution, for instance, an organic solvent, and they can be aligned, if necessary with electrical means or with chemical means. For instance, positioned with a monolayer for preferred adhesion or, with channels wherein the nanowires are positioned by microfluidic transport. Particularly with nanowires, but more in general, the first and second layer can be patterned so as to form an interdigitated structure.

In an embodiment of the magnetoresistive device of the invention, an electrically conducting layer is present between the magnetic layers and the non-magnetic spacer layer. This electrically conducting layer is present to protect the magnetic layers against oxidation, especially during manufacture, but also thereafter. Without such a protection, the complete surface of the magnetic layers will oxidize, and hence there will not be an adequate contact between the magnetic layers and the spacer layer. An adequate contact reduces the contact resistance, but also the spin flip scattering that would otherwise occur in the oxide. The electrically conducting layer preferably comprises gold, but may comprise, among other materials, platinum, tungsten, copper, titanium nitride and tantalum nitride as well. The embodiment is especially suitable for those magnetic layers which are very sensitive to oxidation, such as Co, Fe, Ni and alloys thereof.

It is a first advantage of the embodiment that the manufacture of the lateral device is simplified. The half-ready device can be taken from a vacuum environment without disastrous consequences for the magnetic layers. This allows the use of different machines for the deposition of the different kinds of materials used for the magnetic layers, for the as spacer layer and for further layers.

It is a second advantage of the embodiment that the spacer layer of organic material can be deposited by any kind of coating or printing process. Examples of coating processes are spin-coating and dip-coating. An example of a printing process is ink jet printing. Combining printing with the deposition in vacuo of the magnetic layers does not seem feasible realizable otherwise, as printing cannot be done in vacuo. Furthermore, without an electrically conductive layer the—generally organic—solvents used in printing and coating would reach the magnetic layers. This would have a detrimental effect on the magnetic layers. Printing and coating processes have the advantage over evaporation and sputter deposition that they are cheaper and easier to control.

In a further embodiment, a tunnel barrier layer is present between the magnetic layers and the electrically conducting layer. This is especially preferable if the contribution of the resistance of the organic spacer layer to the total resistance is larger than the contribution of the resistance of the magnetic layers. This improves the spin polarization of the current injected from the magnetic layers, as was explained by E. I. Rashba (Physical Review B62, 16267 (2000)) for the general case of a system in which the spacer layer between the two magnetic electrodes has a low conductance. Preferably, the tunnel barrier layer is an insulating layer, for example of $Al_2O_3$ with a thickness of the order of 1 to 3 nm.

In a yet further embodiment, the magnetic layers are present between the non-magnetic spacer layer and the substrate. This implies that the magnetic layers are deposited before the spacer layer. As an organic layer is generally sensitive to various chemicals, it is most practical to deposit such a layer on top of the others. The organic layer, is for example, sensitive to etching compositions, which are in common use for to patterning the magnetic layer.

The organic semiconductor material may be doped in order to let it act as an electrically conducting material. Examples of such materials are doped poly (3,4-ethylenedioxythiophene), polyaniline and polyacetylenes. Alternatively, a polymer filled with electrically conducting particles or powder may be used. Examples of organic semiconductors include polythiophenes, polyfuranes, polypyrroles, polythienylene-vinylenes, polyphenylene-vinylenes, polyfuranylene-vinylenes, copolymers of these compounds, pentacene, oligothiophenes, polyarylamines and charge-transfer complexes such as tetracyanoquinodimethane-tetrathiafulvalene. Alternatively, substituted derivatives of these compounds can be used. Examples of suitable substituents include alkyl and alkoxy groups and cyclic groups, such as alkylenedioxy groups. Preferably, the substituent groups have a carbon chain of 1 to 10 carbon atoms. Suitable and preferred materials comprise poly-3-alkylthiophenes, pentacene and oligothiophenes.

In an advantageous embodiment, the semiconductor material is doped, and an electrode is in contact with the spacer layer such that charge transport between the first and second magnetic layers can be modified through the application of a suitable voltage to the electrode. The magnetoresistive device of this embodiment is a so-called Johnson spin-switch device.

If the organic semiconductor material is not or not intentionally doped to let it act as a semiconducting material, an electrode ("gate") may be present. This gate is meant to influence the charge distribution in a region of the spacer layer located between the first and the second magnetic layer. The electrode is separated from the organic semiconductor by a layer of dielectric material. The electrode may be present at the first side or at the second side of the spacer layer.

In this embodiment, the magnetoresistive device is a three-terminal device, which is analogous to a field-effect transistor. It can be switched on or off by means of said third electrode. If it is switched on, the magnetoresistive effect can be measured. Since this switch function is incorporated, no independent transistor is needed to act as a switch. Such a switch is, for example, necessary for the operation of an MRAM device. Therefore, a substantial reduction in cost for the individual transistors and for the assembly is achieved with the embodiment.

Proposals that aim at integrating the switching and magnetoresistive functions in a single device by combining ferromagnetic and inorganic semiconductor materials in a single device are known, for example, from Datta and Das (Appl. Phys. Lett. 56, 665 (1990)). However, the known proposal is strictly theoretical.

It is important to counteract any leakage through the spacer layer from one magnetoresistive element with a first and a second magnetic electrode to another especially in the embodiment with a gate, but also without a gate. Therefore, in an advantageous embodiment, the spacer layer of organic material is relief-structured. The structuring of the spacer layer may be realized in various ways, e.g. photochemically or by printing.

The magnetic layers in the device of the invention are generally ferromagnetic. However, it is not to be excluded that at least one of the magnetic layers is antiferromagnetic.

An electronic device of the kind mentioned in the opening paragraphs is known from Tehrani et al., *Journal of Applied Physics*, 85 (1999), 5822. The known electronic device is an MRAM device, in which a large number of identical GMR elements is integrated on a substrate in the form of a matrix of essentially identical cells. The matrix comprises parallel horizontal and vertical current lines—generally referred to as word lines and bit lines, with the magnetoresistive devices at the points of intersection. A preferred method of addressing a specific cell, in order to retrieve the digital information written in the cell, is to provide a voltage difference between the end terminals of the horizontal and the vertical current line, and to measure the resulting current. In order to ensure that the measurement current flows only through the magnetoresistive device at the intersection of the two contacted lines, and not through other elements via more comples paths, a diode or a transistor with a high on/off ratio is combined with each magnetoresistive device.

It is a disadvantage of the known electronic device that the necessity of an independent diode or transistor makes the manufacturing cost for MRAM comparatively high. It is a second object of the invention to provide an electronic device of the kind described in the opening paragraph into which magnetoresistive devices can be easily integrated.

The second object of the invention, i.e. to provide an electronic device with an improved magnetic memory, is realized in that the magnetoresistive device of the invention is present. The electronic device incorporates all advantages of the individual magnetoresistive devices of the invention and especially the advantage of lower manufacturing costs. Furthermore, the magnetoresistive device of the invention can be flexible. Therefore, the magnetoresistive device of the invention is very suitable for use in handheld, flexible, and inexpensive electronic devices. Examples of these are smartcards, transponders and the like.

As in the known electronic device, word lines and bit lines are necessary for addressing the individual magnetoresistive devices. Of these mutually crossing wordlines and bit lines, one may be present below and the other on top of the magnetoresistive devices, for example at the first and at the second side of the spacer layer. However, it is advantageous if both the word lines and the bit lines are present in the substrate. Such a substrate may be a multilayer ceramic substrate or a multilayer laminate. Alternatively, it is a multilayer interconnect structure that is present at a surface or in an integrated circuit. As will be understood by those skilled in the art, the MRAM of the present invention may contain other lines next to or instead of word lines and bit lines. An example of this is a scheme with discrete magnetoresistive devices and discrete transistors as published by P. K. Naji et al., Proceedings of the IEEE International Solid-State Circuits Conference, p. 122–123 (2001).

It is preferable that the magnetoresistive device of the invention is provided with a gate electrode. However, this is not necessary. Owing to its lateral structure, the magnetoresistive device can be integrated into an interconnect structure of a semiconductor device in an efficient manner.

Figure 2:
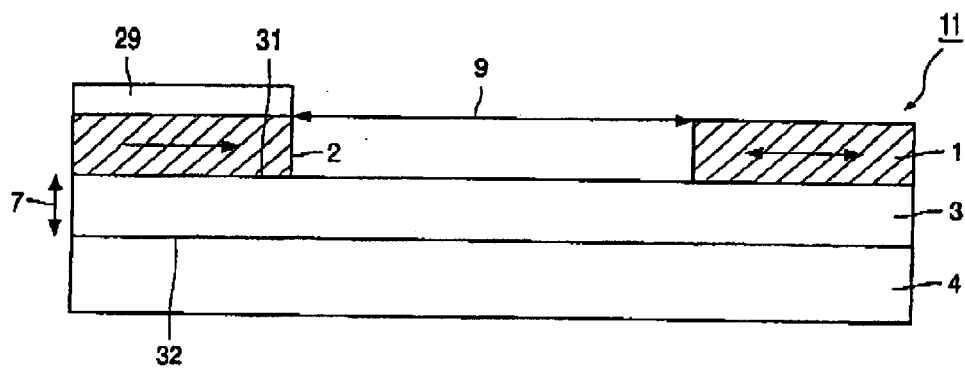
Figure 3:
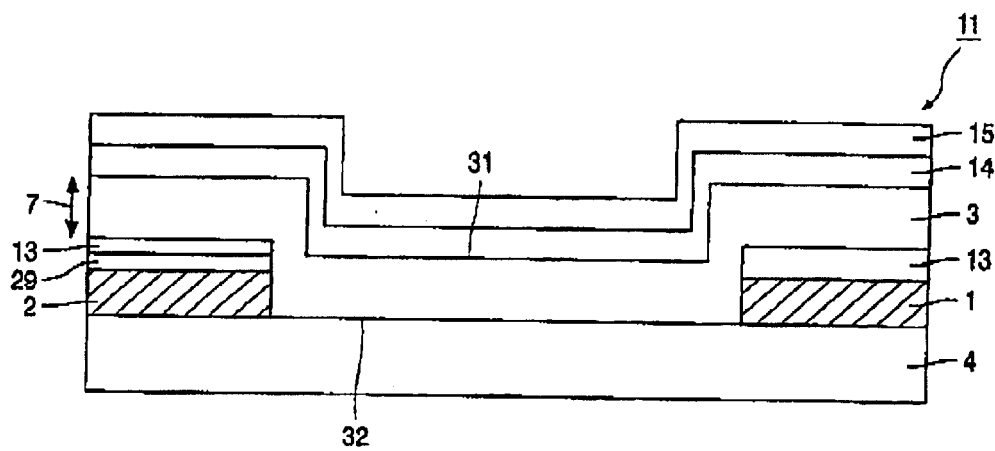
Figure 4:
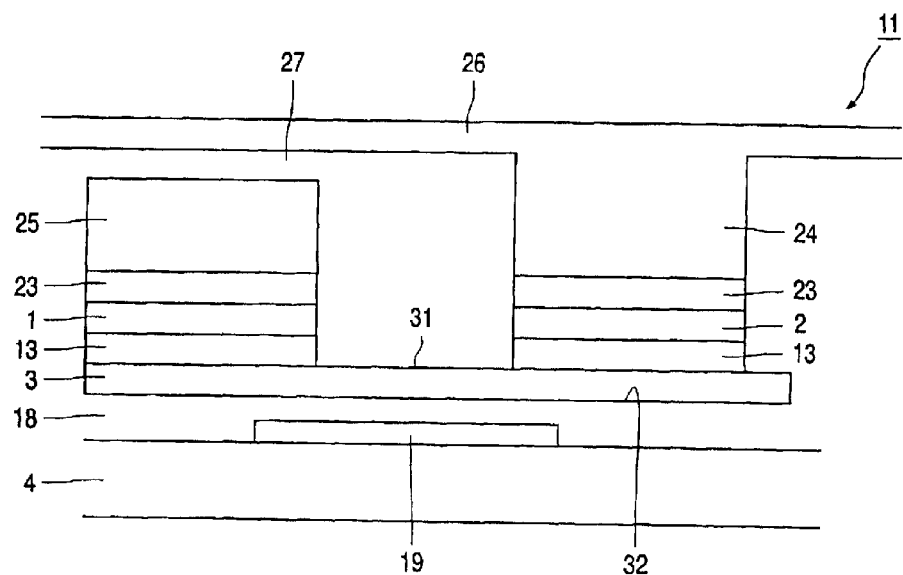
Figure 5:
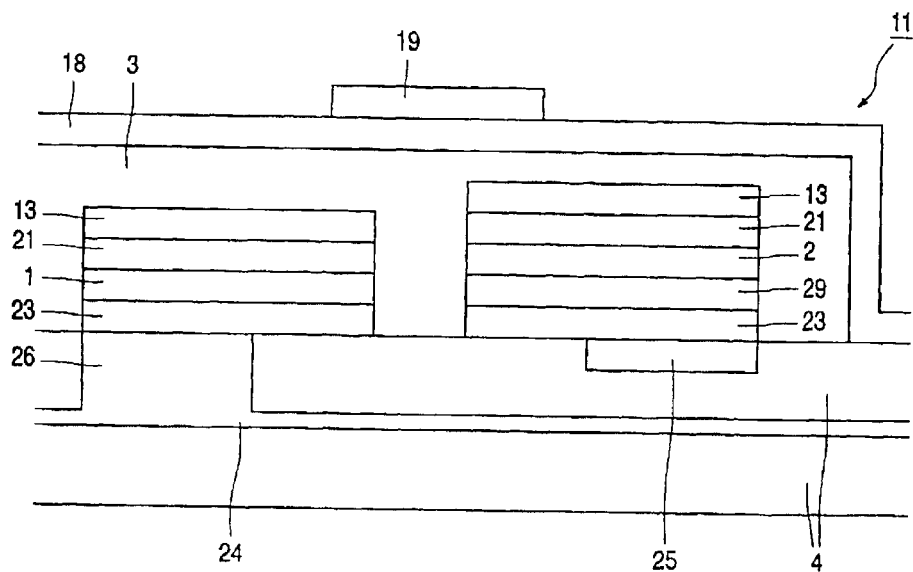

These and other aspects of the magnetoresistive device of the invention will be apparent from and elucidated with reference to the embodiments described hereafter. In the drawings:

FIG. 1 diagrammatically and in cross-section shows the magnetoresistive device according to the prior art;

FIG. 2 grammatically and in cross-section shows a first embodiment of the magnetoresistive device;

FIG. 3 grammatically and in cross-section shows a second embodiment of the magnetoresistive device;

FIG. 4 grammatically and in cross-section shows a third embodiment of the magnetoresistive device; and FIG. 5 grammatically and in cross-section shows a fourth embodiment of the magnetoresistive device.

The Figures are diagrammatic and not drawn to scale, and, in general, like reference numerals refer to like parts. The embodiments represent a device in which the first ferromagnetic layer 1 is the free layer and the second ferromagnetic layer 2 is the pinned layer. However, other embodiments known to those skilled in the art of magnetoresistive devices are possible as well. These embodiments may be integrated into the systems of the invention according by techniques known to those skilled in the art. For example, the whole sensing system or data storage system may be integrated on one semiconductor integrated circuit with the layers of the magnetoresistive device being grown or deposited on the chip. Said layers are preferable grown or deposited in the back end of the process of manufacturing the IC. In the back end process, part of the IC is planarized and the ferromagnetic layers are grown or deposited thereon. The non-magnetic spacer layer of organic material is deposited. Appropriate connections by bonding or via structures are made in order to transfer the signals of the magnetoresistive device to the part of the IC containing the signal processing logic. It will be apparent to those skilled in the art that alternative, equivalent embodiments of the invention may be conceived and put into practice without departing from the true spirit of the invention, the scope of the invention being limited by the appended claims only.

FIG. 1 diagrammatically and in cross-section shows a magnetoresistive device 10 of the prior art. The known magnetoresistive device 10 comprises a stack of a first, free ferromagnetic layer 1, a metallic non-magnetic spacer layer 3, a second, pinned ferromagnetic layer 2, and a fixing layer 5 of an antiferromagnetic material, which stack 10 is present on a substrate 4 (e.g. glass, a semiconductor material such as Si, or a ceramic material such as $Al_2O_3$).

The first and second ferromagnetic layers 1,2 can be manufactured as known in the art. They may comprise a ferromagnetic metal such as Fe, Ni, Co or an alloy thereof. Alternatively, they may comprise a metalloid ferromagnet such as PtMnSb, NiMnSb, $Fe_3O_4$ or $CrO_2$. Preferably, the first ferromagnetic layer is pinned and the second one is free. In order to have an adequate pinning, the pinned ferromagnetic layer is preferably exchange biased with the fixing layer of a antiferromagnetic material such as Ni—Mn, Pt—Mn, Ir—Mn, Fe—Mn or NiO, or a ferromagnetic layer such as Tb—Fe. Alternatively, an artificial antiferromagnet, generally referred to as AAF, is present as the pinned ferromagnetic layer. Said AAF is a layer structure comprising alternating ferromagnetic and non-magnetic layers which have such an exchange coupling, owing to the choice of materials and layer thicknesses, that the magnetization directions of the ferromagnetic layers are antiparallel in the absence of an external magnetic field. An even more preferable structure for pinning the second ferromagnetic layer (F2) is a combination of an antiferromagnetic layer (AF) and an AAF. The AAF then preferably consists of two ferromagnetic layers separated by a non-ferromagnetic spacer layer that strongly couples these two layers antiferromagnetically. The layer structure is then AF/AAF/F2.

Owing to the GMR effect, the resistance for the configurations, in which the magnetizations of the electrodes are parallel or antiparallel, is different. The state of the memory ('1' or '0') can be determined by measuring the resistance of the magnetoresistive device, as is known by those skilled in the art of GMR devices. To this end the relation between a reading or sensing current $I_r$ and an applied voltage is measured.

FIG. 2 diagrammatically and in cross-section shows a first embodiment of the magnetoresistive device of the invention; in the invention the non-magnetic spacer layer 3 has a first side 31 and an opposite second side 32, at which first side 31 the spacer layer is in contact with the free ferromagnetic layer 1 and with the pinned ferromagnetic layer 2, both of which ferromagnetic layers 1, 2 are patterned. The magnetoresistive device 11 is a lateral structure. In this specific embodiment, the substrate 4 is present at the second side 32 of the spacer layer 3. The non-magnetic spacer layer is made of an organic semiconductor material. An antiferromagnetic pinning layer 29 of Ir—Mn is present on top of the second ferromagnetic layer 2.

As an example, the magnetoresistive device 11 comprises the substrate 4 of polyimide, the free ferromagnetic layer 1 of the alloy $Co_{90}Fe_{10}$ (indicated below briefly as CoFe) having a thickness of about 10 nanometers and a size of about 500×2000 nanometers, the non-magnetic spacer material 3 of polythienylene-vinylene having a thickness 7 of 50 nanometers, the pinned ferromagnetic layer 2 of CoFe having a thickness of about 10 nanometer and a size of about 500×2000 nanometers. The distance 9 between the free and the fixed ferromagnetic layers 1,2 is 200 nanometers.

Said device is manufactured by spincoating the non-magnetic spacer layer 3 from a precursor polymer of polythienylene-vinylene onto the substrate 4 and converting it into polythienylene-vinylene. Said deposition and the conversion are known to those skilled in the art of organic devices, such as organic displays and organic transistors. Subsequently, the substrate 4 with the spacer layer 3 is brought into a dc magnetic sputtering machine, where in an atmosphere of about $10^{-7}$ Torr first a layer of Au with a thickness of 3 nm and then a layer of CoFe are sputtered at a deposition rate of 0.2 nm/s. Then, a resist layer is deposited, which is exposed/irridiated and developed. The layer of CoFe is etched into a pattern, thus creating the first ferromagnetic layer 1. Subsequently, another layer of CoFe and a layer of Ir—Mn are sputtered. These layers are patterned by means of photolithography so as to form the second ferromagnetic layer 2 and the pinning layer 29. An acidic substance such as dilute sulphuric acid is suitable for the etching process.

Alternatively, a resist layer, for example the commercially available novolak photoresist HPR504, may be spincoated onto the spacer layer 3 of polythienylene-vinylene. The novolak resist layer is heated to 100° C. for one minute to produce a dry film thickness of 50 nm. The novolak is then patterned by exposure to UV radiation and developed using aqueous base PD 523 to create openings. Subsequently, the structure of the substrate 4, the spacer layer 3 and the novolak pattern is transferred to the sputtering machine to deposit the layer of CoFe, therewith forming the first and the second ferromagnetic layers 1,2. On top of the CoFe, Cu is deposited to provide terminals. After deposition of the Cu, any superflous CoFe and Cu on top of the novolak are removed by rinsing the novolak. Alternatively, the structure may be polished.

FIG. 3 diagrammatically and in cross-section shows a second embodiment of the magnetoresistive device of the invention. In this specific embodiment, the ferromagnetic layers 1,2 and the substrate 4 are present at the first side 31 of the spacer layer 3. A protective coating 15 is present at the second side 32.

The ferromagnetic layers 1,2 are present on the substrate 4. The substrate 4 also contains the contacts, with which the magnetoresistive device is connected to a power supply. An electrically conductive coating 13 of gold is present in a thickness of 3 nm on top of both ferromagnetic layers 1,2, at the first side 31 of the spacer layer. The conductive coating 13 is deposited by means of sputter deposition in an atmosphere of $10^{-7}$ Torr. This coating protects the ferromagnetic layers 1,2 against oxidation by air or by any other oxidant. On top of the conductive coating 13, the non-magnetic spacer layer 3 is present in a thickness 7 of 50 nm. In this example, the spacer layer 3 comprises the organic semiconductor material poly-3-hexylthiophene. An insulating layer 14 and a protective black coating 15 are present at the second side 32 of the spacer layer 3. The protective black coating 15 protects the organic semiconductor material against the influence of oxygen and light. It comprises, for example, carbon ink.

In the manufacture of the device, the structure comprising the substrate 4, the still unpatterned ferromagnetic layer comprising the layers 1,2, and the conductive coating 13, is taken out of the low-pressure environment. The spacer layer 3 of organic material, the insulating layer 14 of polyimide or the like, and the black protective coating 15 are then deposited thereon.

FIG. 4 diagrammatically and in cross-section shows a third embodiment of the magnetoresistive device of the invention. In this specific embodiment, a "gate" electrode 19 is present for influencing a charge distribution in a region of the spacer layer 3 located between the first and the second ferromagnetic layer 1,2. In this embodiment, the spacer layer is not or not intentionally doped. In this specific embodiment, the substrate 4 is present at the second side 32 of the spacer layer 3. The gate electrode 19 is present between the substrate 4 and the spacer layer 3. It is separated from the spacer layer 3 by the dielectric layer 18. The first and the second ferromagnetic layers 1,2 are present at the first side 31 of the spacer layer 3. They are protected from the spacer layer 3 and the substrate 4 by electrically conductive layers 13, 23. The first ferromagnetic layer 1 is connected to a word line 25. The second ferromagnetic layer 2 is connected to a ground line 24. The ground line 24 and the word line 25 extend in directions which are preferably mutually perpendicular. They are present in an array with a plurality of magnetoresistive devices 11. The gate electrode 19 is connected to a bit line via the substrate 4. The spaces between the ground line 24 and the word line 25 are filled with a dielectric material which has a low dielectric constant in order to limit parasitic capacitive coupling.

FIG. 5 diagrammatically and in cross-section shows a fourth embodiment of the magnetoresistive device of the invention. In this specific embodiment, a "gate"-electrode 19 is present for influencing a charge distribution in a region of the spacer layer 3 located between the first and the second ferromagnetic layer 1,2. In this embodiment, the spacer layer is not or not intentionally doped. In this specific embodiment, the ferromagnetic layers 1,2 and the substrate 4 are present at the first side 31 of the spacer layer 3. The gate electrode 19 is present at the second side 32 of the spacer layer 3. It is separated from the spacer layer 3 by the dielectric layer 18. The ferromagnetic layers are protected from the spacer layer 3 and from the substrate 4 by electrically conductive layers 13, 23. Tunnel barrier layers 21 are present between the electrically conducting layers 13 and the ferromagnetic layers 1,2. The tunnel barrier layers 21 have a thickness of 1.5 nm. The electrically conducting layers 13 have a thickness of 3 nm. The electrically conducting layer 23 has a thickness of 20 nm. It acts not only as a protective layer, but also as a contact pad to vias 26 and interconnects 25. The first ferromagnetic layer 1 is connected to a word line 25 which is present in or on top of the substrate 4. The second ferromagnetic layer 2 is connected to a ground line 24 through a vertical interconnect area 26 in the substrate 4. The ground line 24 and the word line 25 extend in directions which are preferably mutually perpendicular. They are present in an array with a plurality of magnetoresistive devices 11. The gate electrode 19 is connected to a bit line. The spaces between the gate electrode 19 and the ground line 24 are filled with a dielectric material.

In a further embodiment (not shown), the gateelectrode 19 and the connections to the ground line 24 and the word line 25 are all present in the substrate 4, which in that case is an multilayer interconnect structure. The interconnect structure is present on a semiconductor—especially silicon—substrate at a surface of which a plurality of transistors is defined. An insulating layer 14 and a protective coating 15 are present on the spacer layer 3. The insulating layer 14 also acts as a passivating layer. The protective coating is covered by a conventional IC package of, for example, an epoxy mold.

In the summary, the invention presents a magnetoresistive device having a lateral structure and provided with a non-magnetic spacer layer of organic semiconductor material allows the presence of an additional electrode. With this electrode, a switch-function is integrated into the device. Preferably, electrically conductive layers are present for the protection of the ferromagnetic layers (1,2). The magnetoresistive device is suitable for integration into an array so as to act as an MRAM device

What is claimed is:

1. A magnetoresistive device (11) comprising a substrate (4) which carries a first (1) and a second magnetic layer (2) for providing a magnetoresistive effect, said first and second layer (1,2) being interconnected by a non-magnetic spacer layer (3) having a first side and a second side opposite the first side, wherein said first side contacts said first and second layers, and wherein the first and second layers (1,2) are patterned and laterally spaced apart on the substrate (4), and the spacer layer (3) comprises a semiconductor material with a primarily one dimensional molecular structure.

2. A magnetoresistive device (11) as claimed in claim 1, characterized in that the material of the spacer layer (3) is an organic semiconductor material.

3. A magnetoresistive device (11) as claimed in claim 1, characterized in that the material of the spacer layer (3) is a nanowire.

4. A device as claimed in claim 2, the organic semiconductor material of the spacer layer (3) is doped to render it electrically semiconductive.

5. A device as claimed in claim 1 characterized in that the magnetic layers (1,2) are ferromagnetic.

6. An electric device provided with a magnetic memory comprising an array of magnetoresistive devices as claimed in claim 1.

* * * * *